United States Patent [19]
Kirichenko

[11] Patent Number: 5,982,219
[45] Date of Patent: Nov. 9, 1999

[54] ASYNCHRONOUS DUAL-RAIL DEMULTIPLEXER EMPLOYING JOSEPHSON JUNCTIONS

[75] Inventor: Alexander F. Kirichenko, Elmsford, N.Y.

[73] Assignee: Hypres, Inc., Elmsford, N.Y.

[21] Appl. No.: 08/892,447

[22] Filed: Jul. 14, 1997

[51] Int. Cl.[6] .................................................. H03K 17/92
[52] U.S. Cl. ............................................................ 327/367
[58] Field of Search ................................... 327/186, 367, 327/528; 326/3–5; 365/162

[56] References Cited

U.S. PATENT DOCUMENTS

| | | | |
|---|---|---|---|
| 4,136,290 | 1/1979 | Davidson et al. | 327/186 |
| 4,501,975 | 2/1985 | Josephs et al. | 327/186 |
| 5,191,236 | 3/1993 | Ruby | 327/528 |
| 5,398,030 | 3/1995 | Sandell | 341/133 |
| 5,598,105 | 1/1997 | Kurosawa et al. | 326/6 |

*Primary Examiner*—Kenneth B. Wells
*Attorney, Agent, or Firm*—Henry I. Schanzer

[57] ABSTRACT

A circuit embodying the invention includes two toggle flip-flops formed using Josephson junctions sharing a common inductive element. One flip-flop is responsive to "zero" input signals (INφ) and the other flip-flop is responsive to "one" input signals (IN1). Each flip-flop has two outputs. The two outputs of the flip-flop responsive to INφ may be identified as Aφ and Bφ and the two outputs of the flip-flop responsive to IN1 may be identified as A1 and B1. The inductive element is settable to either one of two states by controlling the flow of a bias current therethrough. Depending on the state of current conduction through the inductive element, an INφ input signal will produce an output at either Aφ or Bφ and an IN1 input signal will produce an output at either A1 or B1. If, and when, the inductive element is in a first state, an INφ or IN1 input will cause a corresponding output at Aφ or A1, respectively, and will concurrently set the inductive element to its second state. If, and when, the inductive element is in its second state, an INφ or IN1 input signal will cause a corresponding output at Bφ or B1, respectively, and will concurrently cause the inductive element to revert to its first state. Thus, each time an input signal is applied to the circuit, the inductive storage element is toggled from one state to its other state.

9 Claims, 3 Drawing Sheets

ASYNCHRONOUS DUAL-RAIL DEMULTIPLEXER EMPLOYING JOSEPHSON JUNCTIONS

BACKGROUND OF THE INVENTION

This invention relates to a superconducting digital demultiplexer (DEMUX) and, in particular, to a DEMUX employing Josephson junction technology.

In the discussion to follow, the invention will be illustrated using a particular type of Josephson junction technology denoted generally as rapid single-flux quantum (RSFQ) circuitry. The RSFQ circuitry is generally characterized by the use of "overdamped" Josephson junctions which have a single valued current-voltage (I–V) characteristic; i.e., they are non-hysteretic. This also implies that after a current pulse, which exceeds the critical current (Ic), the junction is self-reset to its original superconducting state.

There are many devices such as RSFQ analog-to-digital converters (ADCs) which generate digital data at such a fast rate that conventional semiconductor electronics can not process the data. It is known that by demultiplexing a "fast" data stream into several subsidiary data streams, the rate of the "fast" data stream is effectively slowed in the subsidiary streams. This can be done by distributing the bits of the original fast data stream, one at a time, to several slower digital channels (lines or circuits). By way of example, the "fast" data bits on an input channel can be distributed among N channels where the data rate on the N channels is 1/N times the rate of the input transmitting channel. An advantage of demultiplexing is that the circuits processing the slower data can be made using a slower, less expensive technology. The tradeoff is that more circuitry is required. However, a reduction in speed by a factor of N accompanied by a reduction in cost much greater than N, may result in significant economic advantage. Also, reducing the effective speed enables the data to be coupled to many different electronic circuits.

Although the idea of demultiplexing is known, actual circuits for demultiplexing the extremely high rate of the RSFQ generated data streams need to be developed. Because of the speed involved, it is desirable that the demultiplexers employ Josephson junctions (JJs). Also, in dealing with extremely high speed circuits, the delays in the transmission of signals from one part of the circuit to another, can lead to timing errors relative to some clock signal. Therefore a synchronous operation tied to some clock signal would tend to limit the maximum speed at which the circuit can be operated.

It is therefore an object of the present invention to have a self-synchronizing (asynchronous) demultiplexer which does not require a clock signal.

It is another object of the invention to have an extremely high speed demultiplexer employing Josephson junctions.

It is a still further object of the invention to have a demultiplexer whose sections can be easily cascaded to produce higher order demultiplexing.

It is a still further object of the invention to have a dual-rail (i.e., two input lines) demultiplexer in which information is transferred between circuits by means of two lines with one line carrying (transmitting) the "one" logic signals and the second line carrying (transmitting) the "zero" logic signals.

SUMMARY OF THE INVENTION

A circuit embodying the invention includes two toggle flip-flops sharing a common storage element. A toggle flip-flop as used herein refers to a flip-flop having an input and two complementary outputs (e.g., Q, or direct; and Qb, or inverted). Each toggle flip-flop has two states and each time a signal is applied to its input, the flip-flop produces an output and switches state. That is, when in one state, in response to an input signal the flip-flop produces a signal at one of its two outputs and switches to its second state. When in the second state, in response to an input signal the flip-flop produces a signal at the other one of its two outputs and switches back to its first state. Therefore, the input signal can be thought of as being alternately coupled to the two outputs (direct and inverted) of the toggle flip-flop.

The combination of the two toggle flip-flops sharing a common storage element is suitable for use in a dual-rail demultiplexer circuit embodying the invention. The input of the dual rail circuit includes two input lines; one line for carrying "zero" signals and the other line for carrying "one" signals. The line carrying the "zero" signals is applied to the input of one toggle flip-flop and the line carrying the "one" signals is applied to the input of the other toggle flip-flop. The direct and inverted outputs of each toggle flip-flop function as a dual-rail output.

In one embodiment of the invention, the common storage element shared by the two toggle flip-flops is preferably an inductive element with one flip-flop being responsive to "zero" input signals (IN$\phi$) and the other flip-flop being responsive to "one" input signals (IN1). The two outputs of the flip-flop responsive to IN$\phi$ may be identified as A$\phi$ and B$\phi$ and the two outputs of the flip-flop responsive to IN1 may be identified as A1 and B1. The inductive element is settable to either one of two states by controlling the flow of a bias current therethrough. Depending on the state of current conduction through the inductive element, an IN$\phi$ input signal will produce an output at either A$\phi$ or B$\phi$ and an IN1 input signal will produce an output at either A1 or B1. If, and when, the inductive element is in a first state, an IN$\phi$ or IN1 input will cause a corresponding output at A$\phi$ or A1, respectively, and will concurrently set the inductive element to its second state. If, and when, the inductive element is in its second state, an IN$\phi$ or IN1 input signal will cause a corresponding output at B$\phi$ or B1, respectively, and will concurrently cause the inductive element to revert to its first state. Thus, each time an input signal is applied to the circuit, the inductive storage element is toggled from one state to its other state.

The circuit embodying the invention functions as a demultiplexer. That is, the circuit is toggled each time an input signal (IN$\phi$ or IN1) is applied to it with the input signal IN$\phi$ producing output signals at A$\phi$ or B$\phi$ and the input signal IN1 producing output signals at A1 or B1. Thus, for example, in response to an IN$\phi$ (or IN1) signal, a corresponding output is produced at A$\phi$ or (A1), and the demultiplexer is toggled. In response to the next IN$\phi$ or (IN1) signal, a corresponding output signal is produced at B$\phi$ or (B1) and the demultiplexer is again toggled such that the next IN$\phi$ or (IN1) produces a corresponding output at A$\phi$ or (A1).

The invention is illustrated using superconductive digital electronics and, in particular, Single-Flux-Quantum (SFQ) logic. One embodiment of the invention realized in SFQ technology includes two toggle flip-flops sharing a common storage inductance and bias current source. The storage inductance is connected between first and second bias nodes and a bias current source is applied to the first node. Each one of the two toggle flip-flops includes a signal input and first and second (complementary) outputs with a first Josephson junction connected between its signal input and the first output and a second Josephson junction connected between its signal input and its second output. The first output of each flip-flop is connected via a third Josephson junction to a point of reference potential and via a fourth Josephson junction to the first bias node. The second output of each flip-flop is connected via a fifth Josephson junction to the point of reference potential and via a sixth Josephson junction to the second bias node. The two flip-flops thus include 12 Josephson junctions connected by microstrip inductance lines. The line carrying "one" logic signals is coupled to the input of one of the two toggle flip-flops and a second line carrying "zero" logic signals is applied to the input of the other toggle flip-flop.

Each one of the circuits embodying the invention, described above, functions as a 1:2 demultiplexer cell with one input channel producing two output channels, each output channel carrying data at one-half the speed of the input channel. If an additional 1:2 demultiplexer cell is connected to each one of these output channels, three demultiplexers can be used to produce a total of 4 output channels, each of the four output channels carrying data at ¼ the speed of the original input signal.

BRIEF DESCRIPTION OF THE DRAWINGS

In the accompanying drawings, like reference characters denote like components.

DETAILED DESCRIPTION OF THE INVENTION

Figure 1:
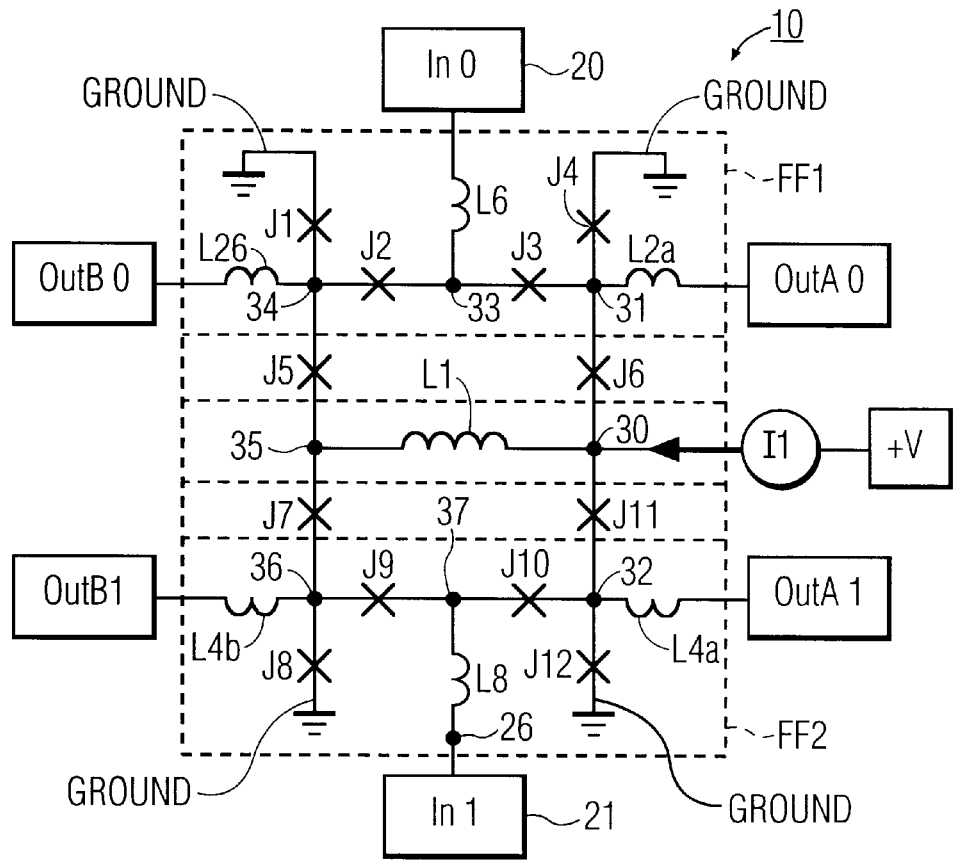
FIG. 1 is a schematic diagram of a demultiplexer circuit embodying the invention.

The circuit of FIG. 1 includes two toggle flip-flops sharing a common inductive element L1 and a source of bias current I1. The bias current is supplied into a node 30 and the inductor L1 is connected between a first common node 30 and a second common node 35. One toggle flip-flop (FF1) includes an input terminal 25 to which is applied a source 20 of logic "zero" input signals (IN0). The other toggle flip-flop (FF2) includes an input terminal 26 to which is applied a source 21 of logic "one" input signals (IN1).

FF1 includes an inductor L6 connected between the input terminal 25 and an intermediate node 33. A Josephson junction, J3, is connected between node 33 and a first output node 31 and a Josephson junction, J2, is connected between node 33 and a second output node 34. Output node 31 is coupled via an inductor L2a to a first output terminal denoted as OUTA0, and output node 34 is coupled via an inductor L2b to a second output terminal denoted as OUTB0. A Josephson junction, J1, is connected between node 34 and ground and a Josephson junction, J4, is connected between node 31 and ground. A Josephson junction, J5, is connected between node 34 and common node 35 and a Josephson junction, J6, is connected between node 31 and common node 30.

In a symmetrical manner to FF1, FF2 includes an inductor L8 connected between the input terminal 26 and an intermediate node 37. A Josephson junction, J10, is connected between node 37 and a first output node 32 and a Josephson junction, J9, is connected between node 33 and a second output node 36. Output node 32 is coupled via an inductor L4a to a third output terminal denoted as OUTA1, and output node 36 is coupled via an inductor L4b to a fourth output terminal denoted as OUTB1. A Josephson junction, J8, is connected between node 36 and ground and a Josephson junction, J12, is connected between node 32 and ground. A Josephson junction, J7, is connected between node 36 and common node 35 and a Josephson junction, J11, is connected between node 31 and common node 30.

To better understand the description of the operation of the circuit to follow, it should be noted that one path for the bias current I1 includes J6, connected between nodes 30 and 31 and J4 connected between node 31 and ground. A second path for the bias current I1 includes J11 connected between nodes 30 and 32 and J12 connected between node 32 and ground. A third path for the bias current I1 includes inductor L1 connected between nodes 30 and 35. A fourth path for the bias current includes J5 connected between nodes 35 and 34 and J1 connected between node 34 and ground. A fifth path for the bias current includes J7 connected between nodes 35 and 36 and J8 connected between node 36 and ground.

Figure 2:
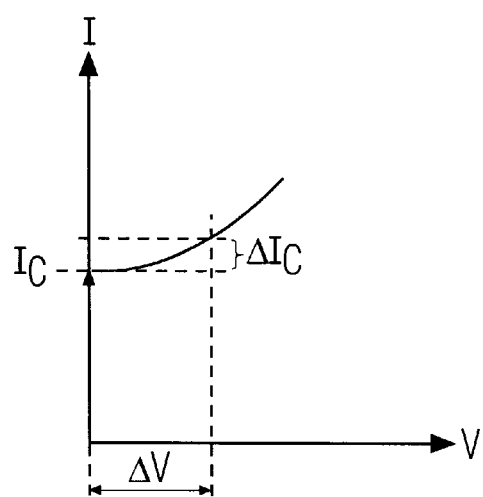
FIG. 2 is a diagram of the current-voltage characteristic of a typical non-hysteretic Josephson junction (JJ)

In the discussion of the operation of the circuit to follow, it is assumed that the Josephson junctions are operated in a non-hysteretic voltage-current as shown in FIG. 2. It is also assumed that the input signal sources 20 and 21 coupled to terminals 25 and 26, respectively, are normally at, or close to, ground potential except when applying input signals, at which point they produce positive going pulses of relatively short duration.

The operation of the circuit of FIG. 1 may be explained as follows. First, assume that the circuit is in a first bias condition in which the inductor L1 presents an impedance to current flow, while junctions J4, J6, J11 and J12 are in their superconductive (zero impedance) state. Since L1 presents an impedance to current flow, the bias current I1 divides between two (zero impedance) paths with one-half of I1 (i.e., I½) flowing through J6 and J4 to ground and one-half of I1 flowing through J11 and J12 to ground. (There may be a very small amount of current flowing through J3, J2 and J1 and/or through J10, J9 and J8. However, for ease of discussion and explanation, these small currents can be ignored.) The bias current I½ flowing through J4 and J6 is designed and selected to be less than the critical current (Ic) of these junctions. Likewise, the bias current I½ flowing through J11 and J12 is designed and selected to be less than the critical current of these junctions. Consequently, the voltage (V31) at node 31 is equal to zero and the voltage (V32) at node 32 is also equal to zero. During this phase of operation, the other junctions are also in their superconductive states and the outputs at nodes 34 and 36 are all at zero volts.

The response of the circuit to a logic "zero" input signal will now be examined. By way of example, assume that a positive going pulse is produced at node 25 (i.e., a logic "0" signal) which is applied to inductor L6 causing a signal current (Is) to flow through the inductor L6 and into node 33. In the discussion to follow, it is assumed that the system is designed such that Is/2 is less than the Ic of the Josephson junctions of the circuit. However, Is/2 plus I½ is greater than the Ic of the junctions. Assume that when an input signal is applied to node 25 that one-half the signal current (Is/2) flows through J2 and J1 to ground and the other half of Is flows through J3 and J4 to ground. Since there is no bias current in J2 and J1, their critical currents are not exceeded and they remain in their superconductive state whereby V34 remains at zero volts. However, when Is/2 flows through J3 and J4 to ground, the total current through J4 is now equal to Is/2 plus I½. Therefore, the Ic of J4 is exceeded and the junction J4 is switched and it is driven to its resistive state causing a positive going voltage pulse to be produced at node 31 and at OUTA. As soon as J4 switches to the high impedance state, and with Is/2 through J3 bucking the bias current which wants to flow in J6, most of I1 now flows through J11 causing the Ic of J11 to be exceeded and J11 to go to its resistive state.

When J11 switches to the resistive state, conduction through J11 is interrupted, the bias current I1 now begins to flow through inductor L1 into node 35. Certain circuit conditions must be noted. Following the production of the voltage pulse at output A0, J4 returns to its superconductive state. Likewise, J11 returns to its superconductive state. However, the current I1 continues to flow through inductor L1 into node 35 (even after J4 and J11 have returned to their superconductive state). Recognizing this condition is an important aspect of Applicant's invention. To wit, once current begins to flow into inductor L1, it is going to continue flowing therethrough until the flow of current through the inductor is positively interrupted. Therefore, virtually all of I1 flows through L1 and virtually none of the I1 current now flows through J6 and J4 or through J11 and J12.

The bias current flowing into node 35 splits with one half of the bias current (i.e., I½) flowing through J5 and J1 to ground and the other half flowing through J7 and J8 to ground. As noted above, I½ is less than the critical current of J7 and J5. Accordingly, the voltages at nodes 34 and 36 remain at ground. The bias current flowing through inductor L1 represents the second or alternate bias condition of the circuit of FIG. 1. It has also been shown that in response to a first input signal the bias current in the circuit has been toggled such that one half of the bias current now flows in the path defined by J5 and J1 and the other half of the bias current flows in the path defined by J7 and J8.

The response of the circuit to the next logic "zero" input signal condition will now be examined. When the next "zero" input signal current occurs, a signal current (Is) is produced and current flows via L6 into node 33. One-half of Is flows through J3 and J4 to ground. However, since no bias current is flowing in J4, J4 remains it its superconductive state and node 31 remains at zero volts. However, as Is/2 flows through J2 and J1 to ground, the current through J1 is now equal to Is/2 plus I½. The sum of Is/2 and I½ exceeds the critical current of J1. Accordingly, J1 is switched to its high impedance state producing a voltage pulse output at OUTB. When J1 switches to the high impedance state, the signal current flowing through J2 blocks the flow of bias current through J5, causing more bias current to flow through J7. The increased current through J7 causes its Ic to be exceeded. When the Ic of J7 is exceeded, J7 switches to its resistive state and blocks or interrupts the flow of current from I1 through L1. Once the current through L1 is interrupted, the bias current I1 into node 30 is again split in half with one-half of the bias current flowing through J6 and J4 to ground and the other half of the bias current flowing through J11 and J12 to ground, as discussed above. This reestablishes the original (first) bias condition of the circuit.

It has thus been shown that when the circuit is biased in a first condition, a logic "zero" input pulse causes an output to be produced at a first output (e.g., OUTAφ) and, concurrently, causes the circuit to be toggled from a first to a second bias condition. The next logic "zero" input pulse causes an output pulse to be produced at a second output (e.g., OUTBφ) and, concurrently, causes the circuit to be toggled to the first bias condition. Thus, in response to an input pulse train at INφ, output pulses are produced alternately at nodes Aφ and Bφ, with the output pulses having one half the frequency of the INφ input pulse train.

The operation of the circuit in response to logic "1" input signals (IN1) is similar to the operation of the circuit just described. Assume that, initially, the bias current I1 flows such that one-half of I1 flows through J11 and J12 to ground and one-half of I1 flows through J6 and J4 to ground. Assume now that a positive going input signal is applied to IN1 at terminal 26 (a logic "1" input signal). The input signal causes a signal current (Is) to flow via inductor L8 into node 37. The signal current splits such that one half of the signal current (Is/2) flows through J9 and J8 to ground. The amplitude of Is/2 current is less than the Ic of J8 and J9 whereby these junctions remain in their superconductive state and the signal at node 36 remains at zero. (Any current flow via J7, J5 and J1 to ground will be very small and these junctions will remain in their superconductive state.) The other half of the signal current (Is/2) flows through J10 and J12 to ground. The total current flowing through J12 is equal to Is/2 plus I½. This total current exceeds the Ic of J12. As a result, J12 switches to its high impedance state and produces a voltage output pulse at node 32 which is coupled via inductor L4a to OUTA1. When J12 switches with Is/2 being pushed through J11, most of I1 (at least a current equal to I½ plus Is/2) flows through J6. The amplitude of the current flowing through J6 exceeds the Ic of J6 and J6 switches to its high impedance state. The bias current I1 then begins to flow into L1. When the logic "1" input pulse returns to ground, J6 and J12 switch back to their superconductive states but the bias current I1 continues to flow through L1. With I1 flowing into L1 a bias current I1 flows into node 35. The bias current splits with I½ flowing through J5 and J1 to ground and I½ flowing through J7 and J8 to ground. Only a minimal amount (if any) of current will flow through J2 or J9.

The next positive going logic "1" signal (IN1) at node 26 produces a signal current which causes J8 to go to its resistive state. This, in turn, produces a positive going pulse at node 36 which is coupled via L4b to the OUTB1 terminal. Concurrently, the current pulse causes J5 to switch to its resistive state, blocking the flow of the bias current through L1. When that occurs, the current I1 stops flowing through L1 and instead I½ flows through J6 and J4 and I½ flows through J11 and J12. Thus, each time a signal is applied at INφ or IN1, the bias current condition changes state. In one state, the bias current I1 flows through L1. In the other state, the bias current I1 does not flow through L1. The path through which the bias current flows determines whether an input signal pulse (INφ or IN1) produces an output pulse at an A output (Aφ or A1) or at a B output (Bφ or B1).

For the bias condition when I1 does not flow through L1, an INφ pulse causes an output pulse to be produced at Aφ, and an IN1 pulse causes an output pulse to be produced at A1. For the bias condition when I1 flows through L1, an INφ pulse causes an output pulse to be produced at Bφ, and an IN1 pulse causes an output pulse to be produced at B1.

Figure 3:
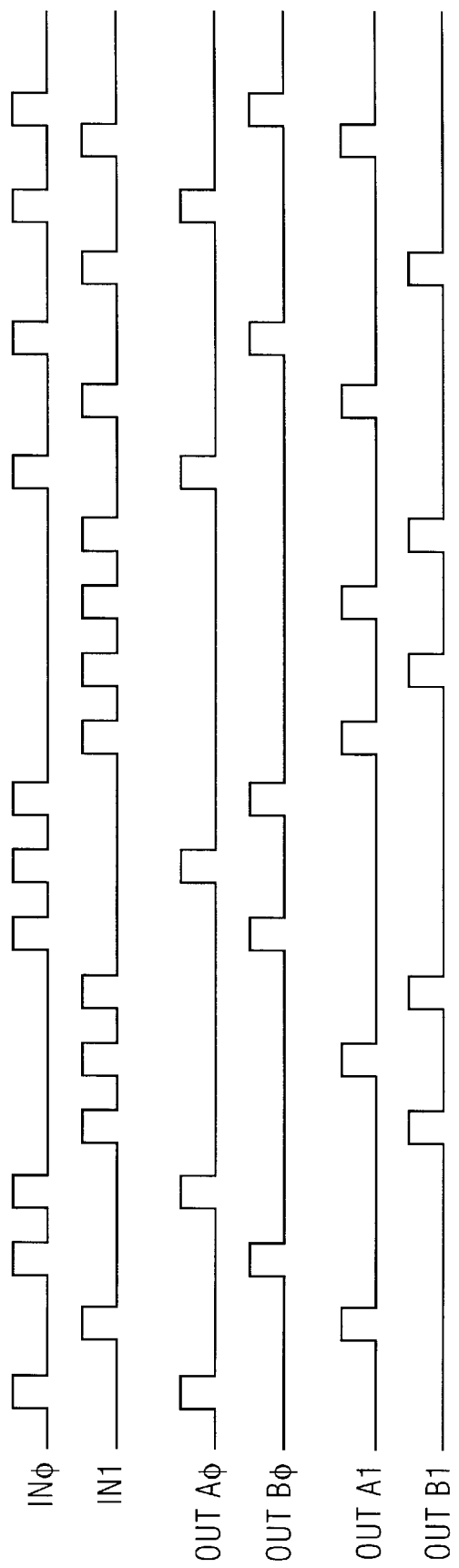
FIG. 3 is a waveform diagram of input pulses and the output pulses distribution from a single demultiplexer circuit.
Figure 4:
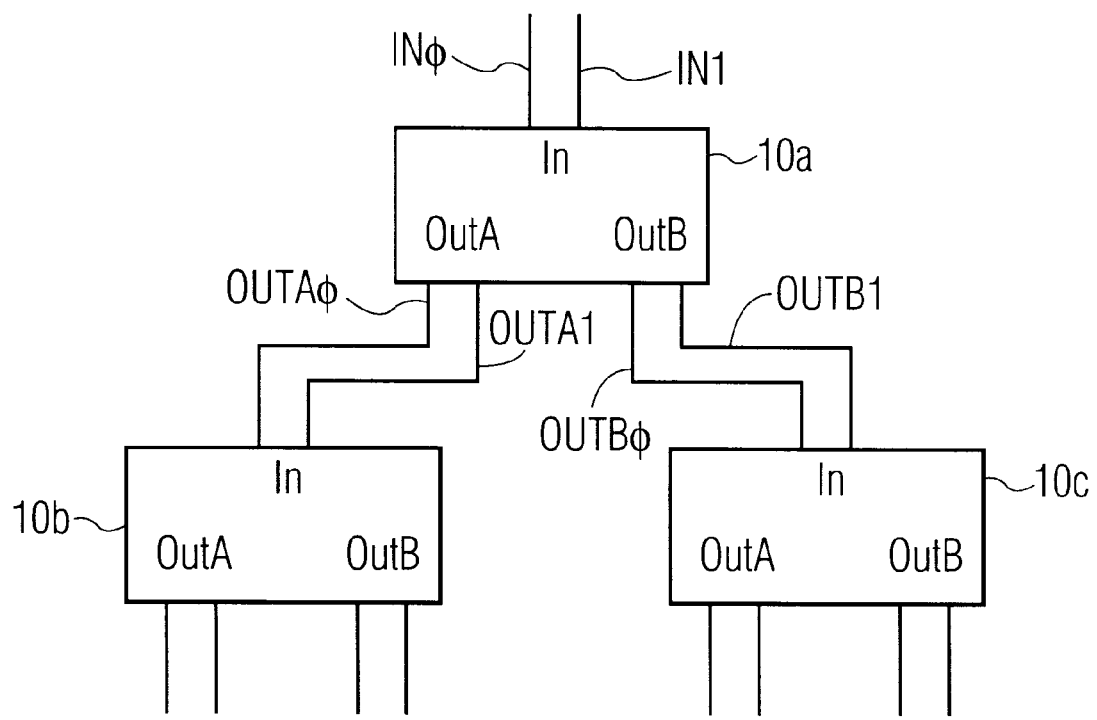
FIG. 4 is a block diagram of three cascaded demultiplexer circuits embodying the invention.

The response of the circuit of FIG. 4 at Aφ, Bφ, A1 and B1 to some arbitrarily selected input signal condition of Inφ and IN1 is shown in FIG. 3.

In a particular design, the critical currents of the various junctions were selected to have the following relative values:

| Ratio of Critical Current of Junctions to Bias Current Through the Junctions | |
|---|---|
| J1, J8 | 1.32 |
| J12, J4 | 1.40 |
| J5, J7 | 2.05 |
| J6, J11 | 1.14 |
| J3, J10 | 1.98 |
| J2, J9 | 1.19 |

Note that a degree of asymmetry is introduced in the design of the components to get improved operating margins. Thus, J1 and J8 are the same, but different from J12 and J4 which are the same. Likewise, J5 and J7 are the same, but different from J6 and J11 which are the same. In a like manner, J3 and J10 are the same, but different from J2 and J9 which are the same.

Finally, as shown in FIG. 4, the circuit of FIG. 1 represented by blocks 10a, 10b and 10c can be interconnected. The circuit of FIG. 1 functions as a demultiplexer cell 10. These cells can be combined in a binary tree as shown in FIG. 4, to enable an increase in the demultiplexing factor without adversely affecting the demultiplexer's performance. In fact, FIG. 4 shows a one-to-four demultiplexer.

What is claimed is:

1. A combination comprising:
   first and second input terminals for the application thereto of first and second pulse signals;
   first and second flip-flops including Josephson junctions; each flip-flop having an input and first and second outputs;
   a first inductor connected between the first input terminal and the input of the first flip-flop and a second inductor connected between the second input terminal and the input of the second flip-flop;
   a source of bias current supplied to a first bias terminal, and an inductive means connected between said first bias terminal and a second bias terminal;
   means connecting a first Josephson junction between the first bias terminal and the first output of the first flip-flop and a second Josephson junction between the first bias terminal and the first output terminal of the second flip-flop; and
   means connecting a third Josephson junction between the second bias terminal and the second output of the first flip-flop and a fourth Josephson junction between the second bias terminal and the second output terminal of the second flip-flop.

2. A combination as claimed in claim 1 wherein for one signal condition, one half of the bias current flows through the first Josephson junction and the other half of the bias current flows through the second Josephson junction and essentially none of the bias current flows through said inductive means, and wherein for another signal condition, the bias current flows through said inductive means and one half of the bias current then flows through said third Josephson junction and the other half of the bias current flows through said fourth Josephson junction and essentially none of the bias current flows through said first and second Josephson junctions.

3. A combination as claimed in claim 1 wherein each flip-flop includes a Josephson junction connected between its input and each one of its outputs, and a Josephson junction connected between each one of its outputs and a point of reference potential.

4. A combination as claimed in claim 3 wherein each one of said first and second flip-flops includes a first output terminal corresponding to its first output and a second output terminal corresponding to its second output and an inductor connected between each one of its outputs and its corresponding output terminal.

5. A combination as claimed in claim 3 wherein each one of the Josephson junctions is a non-hysteretic Josephson junction.

6. A combination as claimed in claim 1 wherein said first pulse signals are logic "zero" signals and wherein said second pulse are logic "one" signals.

7. A combination as claimed in claim 3 wherein the pulse signals supply a signal current and wherein the actual currents of each one of the first, second, third and fourth Josephson junctions is greater than one-half the value of the bias current but is less than the sum of one-half the bias current and one half the signal current.

8. A demultiplexer comprising:
   first, second and third demultiplexer cells;
   each demultiplexer cell having an input and first and second outputs and comprising first and second toggle flip-flops including Josephson junctions with said first and second toggle flip-flops sharing a common bias current source and an inductive storage means and each flip-flop having an input and two outputs; each demultiplexer cell input including two input lines, one line for carrying a stream of logic "one" signals coupled to the input of its first flip-flop and the other line for carrying logic "0" signals coupled to the input of its second flip-flop; the first output of each demultiplexer cell comprising two output lines coupled to the outputs of the first flip-flops for carrying the demultiplexed output of the logic "0" signals and the second output of each demutiplexer cell comprising two output lines coupled to the outputs of the second flip-flop for carrying the demultiplexed output of the logic "1" signals;
   means for applying input signals having a certain frequency to the input of the first demultiplexer cell; and
   means coupling the first output of the first demultiplexer cell to the input of the second demultiplexer cell and means coupling the second output of the first demultiplexer cell to the input of the third demultiplexer cell for producing signals of lower effective frequency than said certain frequency at the outputs of the demultiplexer cells.

9. A combination comprising:
   first and second input terminals for the application thereto of input signals;
   first and second outputs for producing thereat a demultiplexed version of the signals at said first input terminal;
   third and fourth outputs for producing thereat a demultiplexed version of the signals at said second input terminal;
   first and second input nodes;
   a first inductor connected between said first input terminal and said first input node;
   a second inductor connected between said second input terminal and said second input node;
   means connecting a first Josephson junction between said first output and the first input node and a second Josephson junction between said second output and said first input node;

means connecting a third Josephson junction between said third output and the second input node and a fourth Josephson junction between the fourth output and the second input node;

means connecting additional Josephson junctions between each output and a point of reference potential;

a bias current supplied to a first bias node;

a third inductor connected between said first bias node and a second bias node;

means connecting a fifth Josephson junction between the first output and the first bias node and a sixth Josephson junction between the third output and the first bias node; and means connecting a seventh Josephson junction between the second output and the second bias node and an eighth Josephson function between the fourth output and the second bias node.

* * * * *